United States Patent
Razzell

(10) Patent No.: US 11,251,766 B2
(45) Date of Patent: Feb. 15, 2022

(54) ULTRA-WIDE BAND FREQUENCY OFFSET ESTIMATION SYSTEMS AND METHODS FOR ANALOG COHERENT RECEIVERS

(71) Applicant: Maxim Integrated Products, Inc., San Jose, CA (US)

(72) Inventor: Charles Razzell, Pleasanton, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 0 days.

(21) Appl. No.: 17/112,902

(22) Filed: Dec. 4, 2020

(65) Prior Publication Data

US 2021/0218383 A1    Jul. 15, 2021

Related U.S. Application Data

(60) Provisional application No. 62/960,589, filed on Jan. 13, 2020.

(51) Int. Cl.
| | | |
|---|---|---|
| *H03H 21/00* | (2006.01) | |
| *H03H 7/21* | (2006.01) | |
| *H03D 7/16* | (2006.01) | |
| *H03H 11/22* | (2006.01) | |
| *H03H 7/01* | (2006.01) | |

(52) U.S. Cl.
CPC .............. *H03H 7/21* (2013.01); *H03D 7/165* (2013.01); *H03H 11/22* (2013.01); *H03H 2007/0192* (2013.01)

(58) Field of Classification Search
CPC .. H03H 7/21; H03H 11/22; H03H 2007/0192; H03D 7/165
See application file for complete search history.

(56) References Cited

U.S. PATENT DOCUMENTS

| | | | | |
|---|---|---|---|---|
| 6,417,737 B1 * | 7/2002 | Moloudi | ................ | H03B 21/01 330/301 |
| 7,164,901 B2 * | 1/2007 | Zheng | .................... | H03D 3/008 375/320 |
| 8,554,267 B2 * | 10/2013 | Salvi | ..................... | H03H 11/16 455/550.1 |

* cited by examiner

*Primary Examiner* — Dinh T Le
(74) *Attorney, Agent, or Firm* — North Weber & Baugh LLP; Michael North

(57) ABSTRACT

Described herein are systems and methods that allow for correcting a residual frequency offset in the GHz frequency range by using low-complexity analog circuit implementations of a broad-band frequency detector that comprises two analog polyphase filters in a dual configuration. Each filter comprises an RC network of cross-coupled capacitors that facilitate filters with opposite passbands and opposite stopbands. In various embodiments, the outputs of the two filters are combined to obtain power metrics that when subtracted from each other, deliver a measure of the imbalance between the positive and negative halves of a frequency spectrum. Since the measure is substantially proportional to a frequency offset within a linear range spanning 5 GHz or more, the polyphase filters may be used in a broad-band frequency detector that, based on the measure, adjusts the frequency offset.

15 Claims, 11 Drawing Sheets

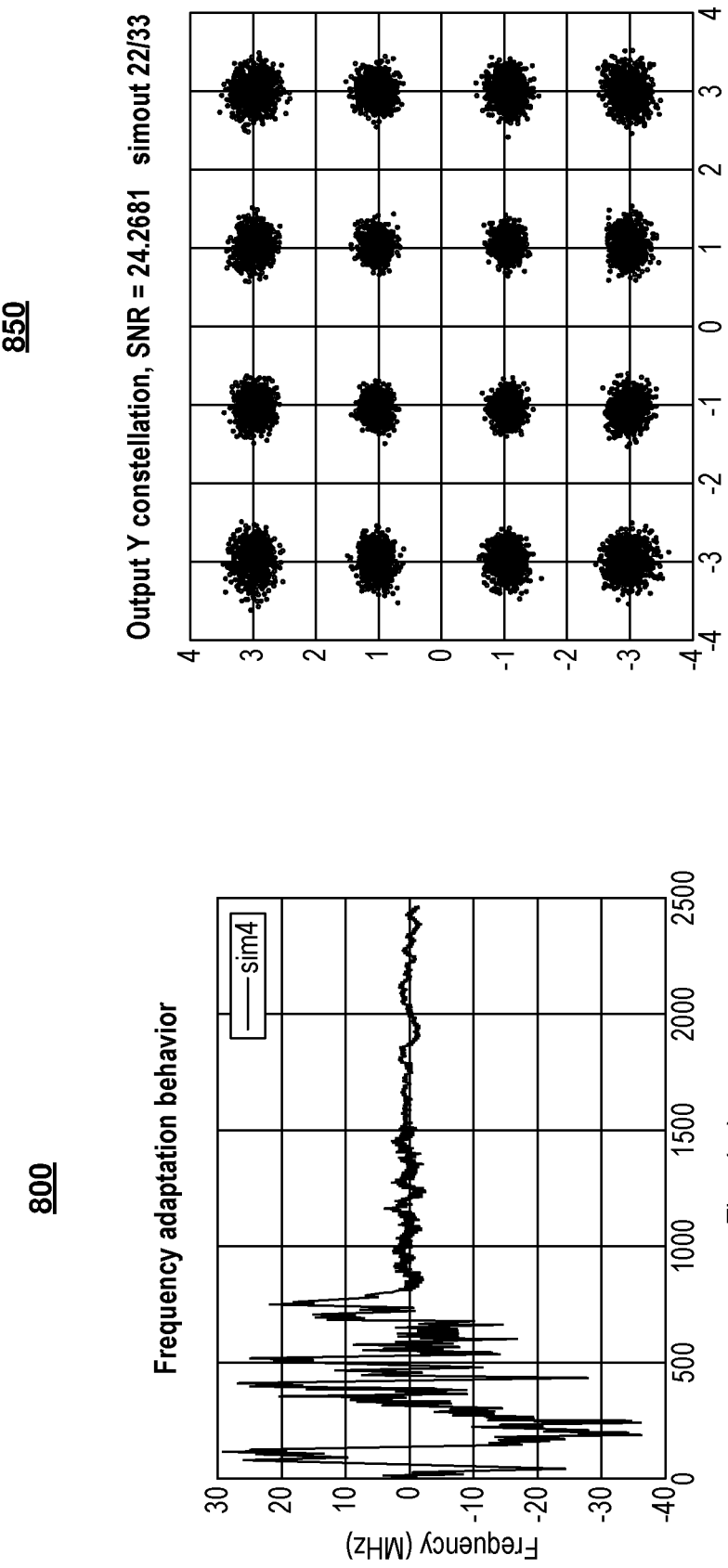

ULTRA-WIDE BAND FREQUENCY OFFSET ESTIMATION SYSTEMS AND METHODS FOR ANALOG COHERENT RECEIVERS

CROSS REFERENCE TO RELATED PATENT APPLICATIONS

This application is related to and claims the priority benefit, under 35 U.S.C. § 119(e), from U.S. Provisional Patent Application, Ser. No. 62/960,589 entitled "Ultra-Wide Band Frequency Offset Estimation Systems and Methods for Analog Coherent Receivers," filed on Jan. 13, 2020 and listing as inventor Charles Razzell. Each reference mentioned in this patent document is incorporated by reference herein in its entirety and for all purposes.

BACKGROUND

The present disclosure relates generally to signal processing in high-speed telecommunication circuits. More particularly, the present invention relates to systems and methods that perform wide band frequency offset estimation in dual-polarization coherent optical transmission and similar applications. In the past few decades, telecommunication networks have seen an ever-increasing demand for bandwidth. Large available bandwidth is a major factor in the increasing popularity of high-speed optical communication systems—whether for transferring data from chip to chip or between Wide Area Network (WAN) fiber-optic links. For example, optical transceivers designed for short-distance (e.g., a few hundred meters) interconnects over optical fiber are in high demand in data center and campus networks.

However, transmitting lasers and receiving lasers in a coherent optical transmission system are independent from each other. Typically, they are located in different parts of a building and operate at different ambient temperatures, etc., thus, causing a large frequency offset between transmitted and received signals that may operate in the THz range. Even a small 0.001% error, therefore, may result in a frequency offset that encompasses potentially several GHz.

Existing frequency control loop approaches use modulation methods have a limited pull-in range, e.g., in the order of ±200 MHz. This relatively narrow range is limited by the ability of the LMS taps to at least partially track the phase of the incoming signal error. At large frequency offsets, this response becomes unreliable or even non-existent.

In contrast, embodiment presented herein allow for correcting a residual frequency offset in the GHz range by using low-complexity analog circuit implementations and methods for a broad-band frequency detector. Advantageously, the frequency detector systems and methods do not depend on other feedback loops having previously converged.

BRIEF DESCRIPTION OF THE DRAWINGS

References will be made to embodiments of the disclosure, examples of which may be illustrated in the accompanying figures. These figures are intended to be illustrative, not limiting. Although the accompanying disclosure is generally described in the context of these embodiments, it should be understood that it is not intended to limit the scope of the disclosure to these particular embodiments. Items in the figures may be not to scale.

FIG. 8A frequency adaptor behavior of for a 0 Hz offset, according to embodiments of the present disclosure.

FIG. 8B shows simulation results for a constellation diagram for a Y-polarization output of an equalizer that uses a broad-band frequency detector, according to embodiments of the present disclosure.

DETAILED DESCRIPTION OF THE PREFERRED EMBODIMENTS

Figure 1:
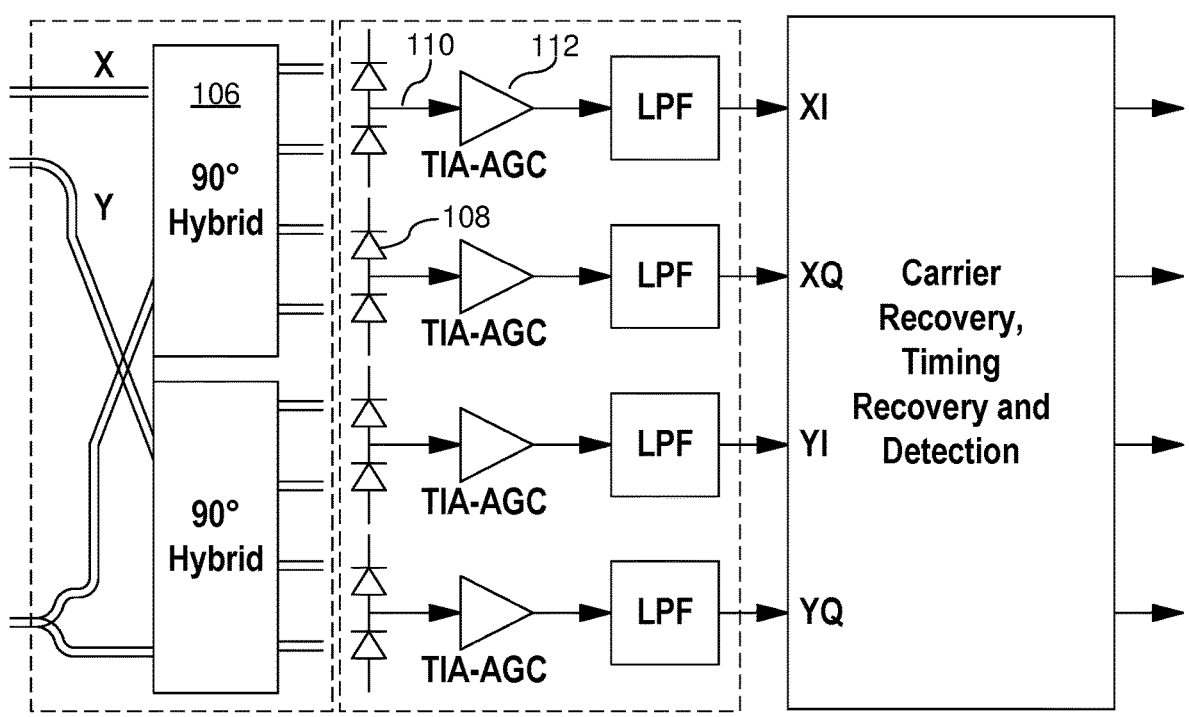
FIG. 1 is a block diagram of a conventional dual polarization quaternary amplitude modulation (DP-QAM) receiver architecture that is based on analog signal processing.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items. All documents cited herein are incorporated by reference herein in their entirety. In this document the terms "discriminator," "frequency discriminator," and "frequency detector" are used interchangeably. Subtracting includes any type of comparison, e.g., using a comparator circuit.

Although embodiments described herein are given in the context of optical communication systems and methods, persons skilled in the art will recognize that the teachings of the present disclosure are not limited to optical communication applications and may equally be used in wired networks, satellite communication, and the like.

Coherent optical links communicate data over different communication channels that correspond to different phases and polarizations of an input signal to the fiber. In a dual-polarization coherent optical transmission system, X- and Y-polarization channels carry ideally independent in-phase (I) and quadrature phases (Q) of the X- and Y-polarizations, conventionally denoted as tributaries XI, XQ, YI and YQ—one for each branch—such that when level 4 pulse-amplitude modulation (4-PAM) is used, each branch yields two bits for every unit interval (UI), and the combination of all four branches yields a total of 8 bits per UI.

FIG. 1 is a block diagram of a conventional DP-QAM receiver architecture that is based on analog signal processing. Receiver 100 is a homodyne receiver driven by an on-channel laser (not shown) that acts as the local oscillator. The arrangement of the polarization beam splitter and 90° hybrids 106 is designed to provide balanced quadrature light outputs for each of the two orthogonal polarizations, conventionally labeled X and Y, which are incident on eight photodiodes 108 that are arranged in balanced pairs. This arrangement results in four bipolar photocurrents 110 that are amplified by respective Trans Impedance Amplifiers (TIAs) 112, corresponding to I and Q-phases of the X- and Y-polarizations, respectively. Thus, four branches of receiver 100, i.e., XI, XQ, YI, YQ, are available for further signal processing in the analog domain.

However, imperfections inherent to the transmitter, receiver 100, and optical fiber introduce unwanted delays that cause polarization and phase in the four channels to arrive at the receiver with unknown phase rotation and phase polarization dimensions that the receiver cannot identify from the recovered information.

For example, since the index of refraction of a fiber channel varies (typically decreasing for increasing wavelength in materials that do not absorb light) with the frequency of the light due to material properties or geometry of the fiber that acts as an optical waveguide, CD and corresponding group delay depend on the optical wavelengths propagated in the form of short pulses of light. Given a signal with sufficiently broad frequency bandwidth, depending on the medium and the wavelength, higher frequencies components of that signal will experience greater group delay than low-frequency components, such that higher frequency spectral components undergo a different delay in the transmission medium than lower frequency components of the same sign. Such temporal spreading of a pulse, which represents the information, significantly increases bit-error rate (BER), decreases the rate at which data can be transported in a channel, and leads to a reduction of the opening in the so-called eye-pattern. Therefore, it is desirable to have systems and methods that mitigate frequency offset and increase the tolerance against errors resulting therefrom.

As is known from patent applications mentioned herein and that are incorporated by reference, existing electronic polarization control loops are useful for separating and phase-aligning dual polarization coherent signals. Least mean square (LMS) adaption is used in the coherent optical signal processor to track random phase rotations and other impairments. LMS adaption is performed using a continuous version of the classic RLMS update equation on eight coefficients held, for example, in analog integrators as charge on capacitors.

Eight coefficients represent a 2×2 complex matrix that is used to separate and phase correct the incoming analog signal:

$$\begin{bmatrix} E_{XO} \\ E_{YO} \end{bmatrix} = \begin{bmatrix} C_{1X} & C_{1Y} \\ C_{2X} & C_{2Y} \end{bmatrix} \cdot \begin{bmatrix} E_{XI} \\ E_{YI} \end{bmatrix}$$

Considering a dual-polarization coherent optical receiver having four independent branches, XI, XQ, YI, and YQ, that represent the I and Q components of two arbitrary orthogonal polarizations X and Y, and neglecting losses and dispersion in the optical channel, the observed X and Y signals in the receiver branches may be represented in complex notation as $$\begin{bmatrix} X_{in} \\ Y_{in} \end{bmatrix} = e^{i\psi/2} \begin{bmatrix} e^{i\phi_1/2} & 0 \\ 0 & e^{-i\phi_1/2} \end{bmatrix} \begin{bmatrix} \cos\theta & \sin\theta \\ -\sin\theta & \cos\theta \end{bmatrix} \begin{bmatrix} e^{i\phi_0/2} & 0 \\ 0 & e^{-i\phi_0/2} \end{bmatrix} \begin{bmatrix} E_{xi} \\ E_{yi} \end{bmatrix},$$

where $\psi$, $\phi_1$, $\theta$ and $\phi_0$ are four real parameters, $\psi$ represents the absolute phase, $\phi_0$ represents relative phase shift between X- and Y-polarization signals before a plane polarization rotation by $\theta$, and $\phi_1$ represents the relative phase shift afterwards. By multiplying all of these sub-components, a single 2×2 complex matrix is obtained that relates the received signal to the transmitted signal as follows:

$$\begin{bmatrix} X_{in} \\ Y_{in} \end{bmatrix} = \begin{bmatrix} \Gamma_{1X} & \Gamma_{1Y} \\ \Gamma_{2X} & \Gamma_{2Y} \end{bmatrix} \begin{bmatrix} E_{xi} \\ E_{yi} \end{bmatrix},$$

The matrix $\Gamma$ is unitary due to the factors that used to create it. Matrix $\Gamma$ is therefore invertible, and an estimate of the original transmitted waveforms may be obtained as:

$$\begin{bmatrix} \hat{E}_{xi} \\ \hat{E}_{yi} \end{bmatrix} = \begin{bmatrix} \Gamma_{1X} & \Gamma_{1Y} \\ \Gamma_{2X} & \Gamma_{2Y} \end{bmatrix}^{-1} \begin{bmatrix} X_{in} \\ Y_{in} \end{bmatrix}.$$

Thus, there exists a new demixing matrix, $C \stackrel{def}{=} \Gamma^{-1}$, which may be substituted into the above matrix equation to yield:

$$\begin{bmatrix} X_{out} \\ Y_{out} \end{bmatrix} \stackrel{def}{=} \begin{bmatrix} \hat{E}_{xi} \\ \hat{E}_{yi} \end{bmatrix} = \begin{bmatrix} C_{1X} & C_{1Y} \\ C_{2X} & C_{2Y} \end{bmatrix} \begin{bmatrix} X_{in} \\ Y_{in} \end{bmatrix}.$$

This represents two linear equations, each having two complex coefficients, i.e., $$X_{out} = C_{1X} X_{in} + C_{1Y} Y_{in}$$

and $$Y_{out} = C_{2X} X_{in} + C_{2Y} Y_{in}.$$

Although these two equations look independent, they derive from only four independent real parameters and, hence, the coefficients on the top and bottom rows of the matrix are not independent from each other. Nevertheless, they may be treated as independent for the purposes of iterating towards a solution as long as they do not converge in a manner such that the top and bottom rows are related to each other by a proportionality constant, i.e., $X_{out} = \alpha Y_{out}$, where $\alpha$ is the proportionality constant.

Solving one of these equations (and assuming that a similar technique may be applied to the other similar equation) provides $X_{out} = C_{1X} X_{in} + C_{1Y} Y_{in}$, in which only the observed signals $X_{in}$ and $Y_{in}$ are known. Although the estimated symbol $\hat{E}_{xi} = X_{out}$ is unknown, it is known that ideal samples of $X_{out}$ should be drawn from the finite alphabet of the modulation constellation in use, e.g., in 16-QAM modulation, which can be considered as 4-PAM signaling in each of the quadrature channels. Hence, for any candidate trial values of $C_{1X}$ and $C_{1Y}$, the error may be estimated as the difference between the nearest valid constellation point and the output signal $X_{out}$, denoted by $Q(X_{out})$ and $X_{out}$. Let $e(X_{out}) \stackrel{def}{=} Q(X_{out}) - X_{out}$. The quantizer, $Q$, may be defined as two 4-PAM modulation quantizers that operate, at least approximately, independently in the I- and Q-dimensions.

Based on the known complex LMS update equation, one may iterate towards a minimum error condition by accumulating into coefficients $C_{1X}$ and $C_{1Y}$ using the following update equations:

$$C_{1X} \Leftarrow C_{1X} + \mu (Q(X_{out}) - X_{out}) \cdot X^*_{in}$$

$$C_{1Y} \Leftarrow C_{1Y} + \mu (Q(X_{out}) - X_{out}) \cdot Y^*_{in}$$

$$X_{out} = X_{in} \cdot C_{1X} + Y_{in} \cdot C_{1Y}$$

Expanding the above complex expressions using:

$$X_{out} \stackrel{def}{=} X_{Iout} + iX_{Qout}; C_{1X} \stackrel{def}{=} C_{1XI} + iC_{1XQ}; C_{1Y}$$
$$\stackrel{def}{=} C_{1YI} + iC_{1YQ};$$

$$C_{2X} \stackrel{def}{=} C_{2XI} + iC_{2XQ}; C_{2Y} \stackrel{def}{=} C_{2YI} + iC_{2YQ}$$

yields for computation of the output for real and imaginary parts of the X-polarization output:

$$X_{Iout} = X_{Iin} \cdot C_{1XI} - X_{Qin} \cdot C_{1XQ} + Y_{Iin} \cdot C_{1YI} - Y_{Qin} \cdot C_{1YQ}$$

$$X_{Qout} = X_{Qin} \cdot C_{1XI} + X_{Iin} \cdot C_{1XQ} + Y_{Qin} \cdot C_{1YI} + Y_{Iin} \cdot C_{1YQ}.$$

The coefficient update equations for the real and imaginary parts of upper row of the coefficient matrix are then:

$$C_{1XI} \Leftarrow C_{1XI} + \mu(Q(X_{Iout}) - X_{Iout}) \cdot X_{Iin} + \mu(Q(X_{Qout}) - X_{Qout}) \cdot X_{Qin}$$

$$C_{1XQ} \Leftarrow C_{1XQ} + \mu(Q(X_{Qout}) - X_{Qout}) \cdot X_{Iin} - \mu(Q(X_{Iout}) - X_{Iout}) \cdot X_{Qin}$$

$$C_{1YI} \Leftarrow C_{1YI} + \mu(Q(X_{Iout}) - X_{Iout}) \cdot Y_{Iin} + \mu(Q(X_{Qout}) - X_{Qout}) \cdot Y_{Qin}$$

$$C_{1YQ} \Leftarrow C_{1YQ} + \mu(Q(X_{Qout}) - X_{Qout}) \cdot Y_{Iin} - \mu(Q(X_{Iout}) - X_{Iout}) \cdot Y_{Qin}$$

Similarly, one may write for the Y-polarization output:

$$Y_{out} = X_{in} C_{2X} + Y_{in} C_{2Y},$$

which expands to:

$$Y_{Iout} = X_{Iin} \cdot C_{2XI} - X_{Qin} \cdot C_{2XQ} + Y_{Iin} \cdot C_{2YI} - Y_{Qin} \cdot C_{2YQ}$$

$$Y_{Qout} = X_{Qin} \cdot C_{2XI} + X_{Iin} \cdot C_{2XQ} + Y_{Qin} \cdot C_{2YI} + Y_{Iin} \cdot C_{2YQ}.$$

And the corresponding update equations are:

$$C_{2X} \Leftarrow C_{2X} + \mu(Q(Y_{out}) - Y_{out}) \cdot X^*_{in}$$

$$C_{2Y} \Leftarrow C_{2Y} + \mu(Q(Y_{out}) - Y_{out}) \cdot X^*_{in}$$

which expand to:

$$C_{2XI} \Leftarrow C_{2XI} + \mu(Q(Y_{Iout}) - Y_{Iout}) \cdot X_{Iin} + \mu(Q(Y_{Qout}) - Y_{Qout}) \cdot X_{Qin}$$

$$C_{2XQ} \Leftarrow C_{2XQ} + \mu(Q(Y_{Qout}) - Y_{Qout}) \cdot X_{Iin} + \mu(Q(Y_{Iout}) - Y_{Iout}) \cdot X_{Qin}$$

$$C_{2YI} \Leftarrow C_{2YI} + \mu(Q(Y_{Iout}) - Y_{Iout}) \cdot X_{Iin} + \mu(Q(Y_{Qout}) - Y_{Qout}) \cdot Y_{Qin}$$

$$C_{2YQ} \Leftarrow C_{2YQ} + \mu(Q(Y_{Qout}) - Y_{Qout}) \cdot X_{Iin} + \mu(Q(Y_{Iout}) - Y_{Iout}) \cdot X_{Qin}$$

The result is eight real-valued update equations that may be used to find the four complex coefficients of the demixing matrix. In embodiments of the present disclosure, these update equations may be implemented in the analog domain as continuous-time integrators.

In embodiments, 16-QAM or NRZ error detection is used in a feedback loop to track the complex coefficients of the 2×2 Jones matrix. In embodiments, to set suitable initial positive or negative tap weights that enable tracking and allow decisions, such as distinguishing the 16 points in a constellation, to be performed with confidence, LMS adaption circuit 210 may use a circuit, such as unitary forcer circuit disclosed in and U.S. Patent Application No. 62/931,122, filed on Nov. 5, 2019, entitled "Analog Coherent Signal Processing Systems and Methods," listing as inventors Charles Razzell and Edem Ibragimov, and U.S. Patent Application No. 62/931,127, filed on Nov. 5, 2019, entitled "Dynamic Error Quantizer Tuning Systems and Methods," listing as inventors Charles Razzell, which applications are herein incorporated by reference as to their entire contents.

Figure 2A:
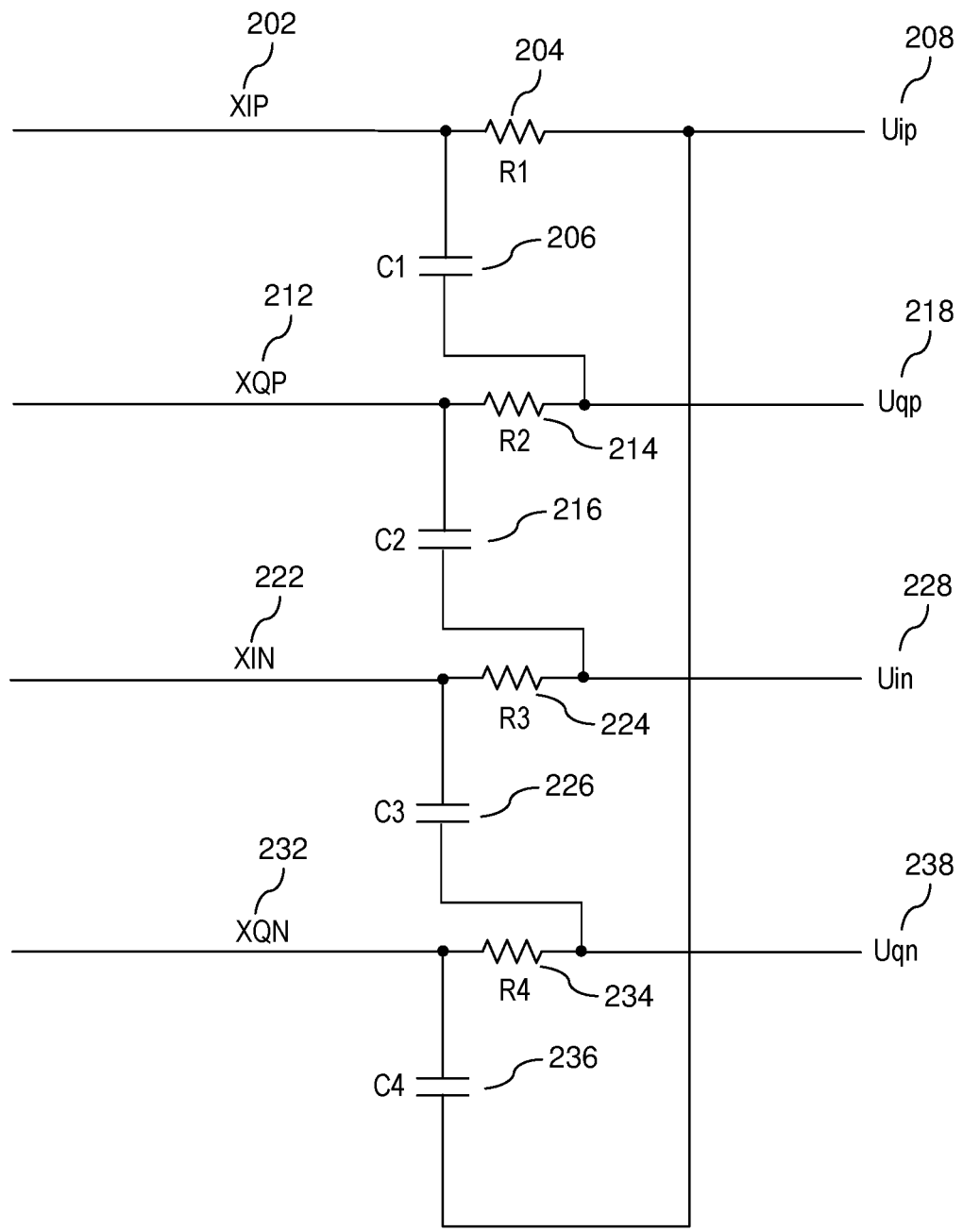
FIG. 2A and FIG. 2B illustrate polyphase analog filter circuits according to embodiments of the present disclosure.
Figure 2B:
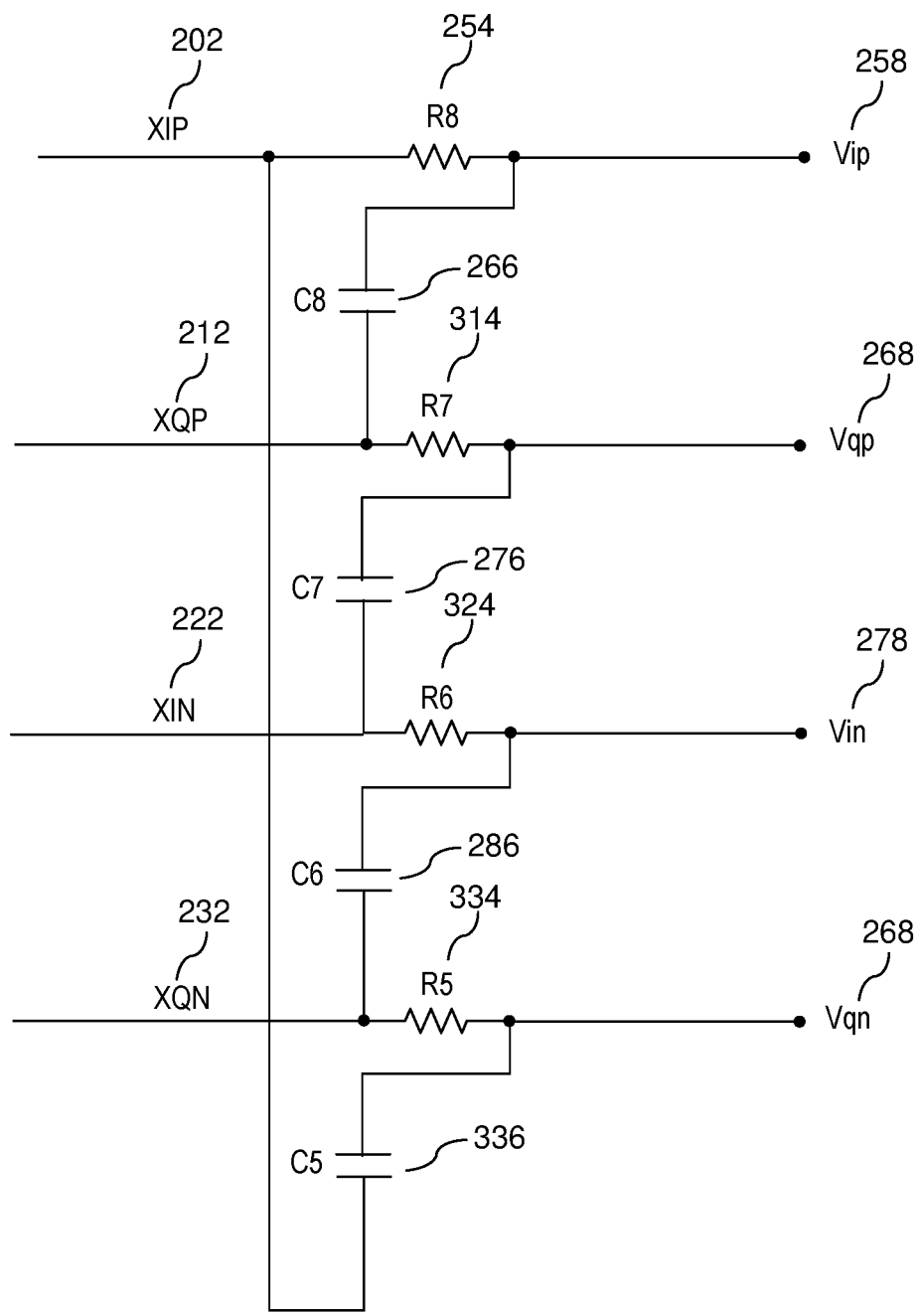

FIG. 2A and FIG. 2B illustrate polyphase analog filter circuits according to embodiments of the present disclosure. As depicted in FIG. 2A and FIG. 2B, both filters may be coupled to the same input signals 202, 212, 222, and 232, e.g., four phases of a polarization signal in the X-branch of a broad-band, zero-IF receiver system. It is noted that, circuits 200 and 250 in respective FIG. 2A and FIG. 2B may be duplicated for the four phases of the in-phase and quadrature signals for the corresponding Y-branch (not shown). In embodiments, the RC network of capacitors and resistors in filters 200 and 250 comprise may advantageously be implemented as low-value components, e.g., as picofarad capacitors that are relatively easy to integrate on a printed circuit board or monolithic silicon integrated circuit. An exemplary RC time constant for filters 200 and 250 is 12 ps.

In embodiments, the capacitors (e.g., 206) and the resistors (e.g., 204) in filter 200 may be cross-coupled in a manner such as to express a rotation, e.g., in a positive direction. For example, the capacitors in FIG. 2A may cause a slope in one direction, and capacitors (e.g., 306) for filter 250 may cause a slope in the opposite direction. As discussed in greater detail with reference to FIG. 4A, in embodiments, polyphase filter 200 may be configured in a manner such as to exhibit a passband characteristic in the positive half of the frequency spectrum. In other words, polyphase filter 200 may be more responsive to signal power at frequencies in a positive half of a signal spectrum than frequencies in a negative half of the frequency spectrum.

Similarly, polyphase filter 250 that may be coupled to I and Q branches 202, 212, 222, 232 of a receiver and may be more responsive to signal power at frequencies in the negative half than to frequencies in the positive half of the frequency spectrum may exhibit a passband characteristic in the negative half of the frequency spectrum, such that the two filters 200 and 250 have opposite passbands as well as opposite stop-bands.

It is noted that while filters 200 and 250 in FIGS. 2A and 2B are depicted as comprising a passive RC network of resistors and capacitors, this is not intended as a limitation on the scope of the present disclosure. As a person of skill in the art will appreciate that polyphase filters 200 and 250 may equally be implemented as active filters or may make use of inductors, or distributed element filter techniques. One skilled in the art will further appreciate that filters 200 and 250 may comprise tunable components, such as switchable capacitor arrays, and the like.

Figure 3:
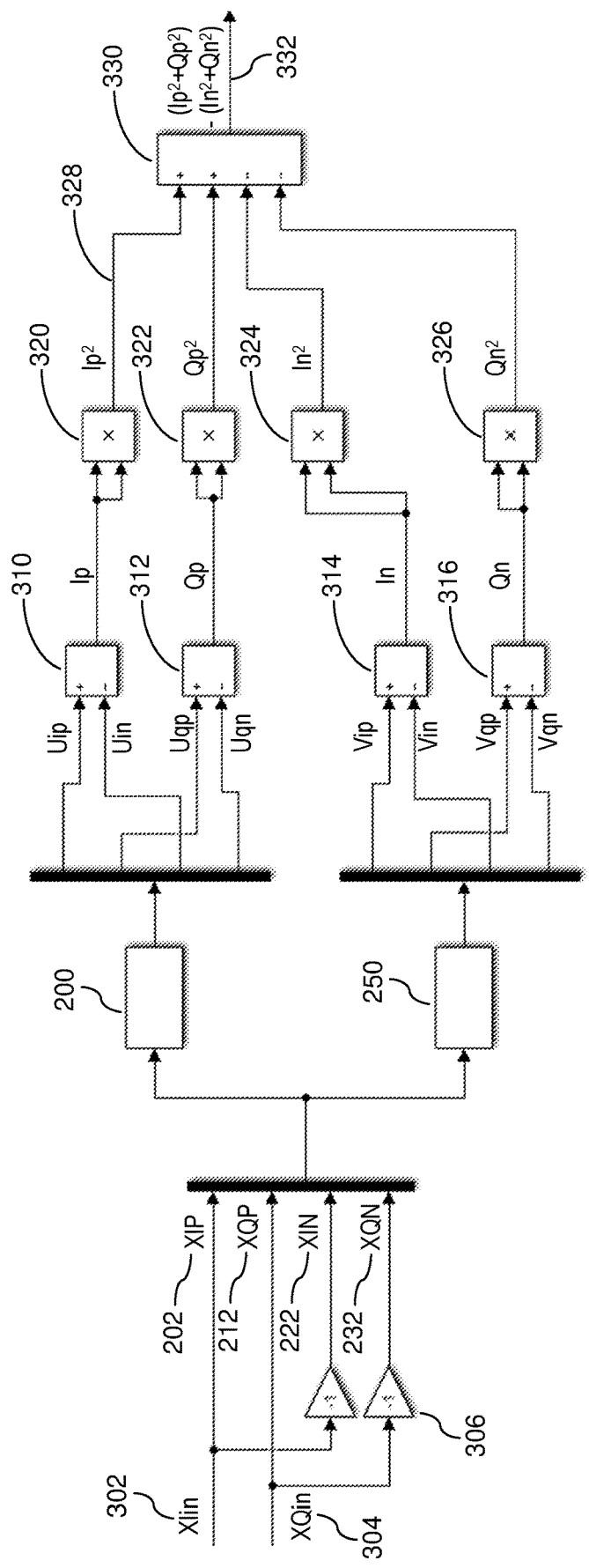
FIG. 3 is an exemplary broad-band frequency detector that uses polyphase filters as illustrated in FIG. 2A and FIG. 2B.

FIG. 3 is an exemplary broad-band frequency detector that uses passive RC polyphase filters as illustrated in FIG. 2A and FIG. 2B. Broad-band frequency detector 300, depicted in FIG. 3, may be implemented as a low-complexity analog circuit that may comprise a power estimation circuit. In embodiments, frequency detector 300 comprises single-ended inputs 302, 304, analog polyphase filters 200, 250, subtractor circuits (e.g., 310, 330), single-ended squaring circuits (e.g., 320), and single-ended outputs (e.g., 328, 332). In embodiments, an averaging circuit (not shown) may be added, e.g., before or after summing element 330, e.g., by implementing a low-pass filter that reduces noise generated by filters 200, 250. In embodiments, squaring circuit 320 may be implemented using a non-linear circuit element that detects a power output by polyphase filter 200.

It is noted that circuit 300 may be duplicated for a corresponding Y-branch. It is further noted that, unlike existing filters that are incapable of distinguishing between positive and negative frequencies, i.e., those provide the same response to both positive and negative frequencies, novel polyphase filters 200, 250 in FIG. 3 may be coupled across four phases (only two 302 and 304 are shown in FIG. 3) of a differential Q and I baseband signal and utilize complex numbers that allow to discriminate between positive and negative frequencies in Q and I channels (e.g., 302, 304).

In detail, the dual two-filter arrangement in FIG. 3 may use negation element 306 to generate from two single-ended X-polarization signals, 302 and 304, two differential outputs, e.g., X-polarization signals having 0°, 90°, 180°, and 270° phases, denoted Uip, Uin, Uqp, Uqn in FIG. 2A and Vip, Vin, Vqp, Vqn in FIG. 2B. In embodiments, polyphase filter 200 rejects high frequencies and polyphase filter 250 rejects low frequencies. This enables filter 200 to output negative frequencies and filter 220 to output positive frequencies. It is noted that any filter implementation that uses a polyphase topology may be used to obtain an asymmetric response for negative and positive frequencies.

In embodiments, cross-coupled capacitors and resistors in filter 200 as shown in FIG. 2A cause the inputs of filter 200 that correspond to X-polarization signals having 0°, 90°, 180°, and 270° phases to be output in the same order before being combined as depicted in FIG. 3, i.e., in a manner such that subtractor 310 receives and subtracts the signals having 0° and 180° phase and subtractor 312 receives and subtracts the signals having 90° and 270° phase to output respective signals, denoted as Ip and Qp in FIG. 3. Likewise, the cross-coupled capacitors and resistors in filter 250 in FIG. 2B may cause the inputs of filter 250 that also correspond to the X-polarization signals to be output and combined such that subtractor 314 receives and subtracts the signals having 0° and 180° phase and subtractor 316 receives and subtracts the signals having 90° and 270° phase to output respective signals, denoted In and Qn in FIG. 3.

In embodiments, the passband characteristic of polyphase filter 200 in the positive half of the frequency spectrum allows to measure or compute the power in that half of the frequency spectrum to obtain a first power metric. Similarly, having the passband of polyphase filter 250 in the negative half of the frequency spectrum allows for measuring the power in the frequency spectrum to obtain a second power metric. In other words, filter 200 may be responsive to positive frequencies and enable the first power metric, while rejecting negative frequencies with filter 250 being the symmetric opposite of filter 200 and enable the second power metric. As an example, one of the two polyphase filters 200, 205 may operate, for example, between +1 GHz and +15 GHz, whereas the other operates between −1 GHz and −15 GHz.

In embodiments, offsetting a signal within filters 200, 250 may provide different amounts of power that represent the frequency offset. In embodiments, the outputs of filters 200 and 250 may be combined in a manner such as to obtain power metrics therefrom that when subtracted from each other, deliver a measure of the imbalance between the positive and negative halves of the spectrum. In embodiments, to obtain a measure of imbalance, squaring circuits (e.g., 320) perform a squaring process that squares the outputs of subtractors 310, 312, 314, 316 to generate signals that correspond to squared magnitude values, e.g., to determine which of filter 200 and 250 outputs a greater signal. In embodiments, squared outputs that are associated with positive frequencies in filter 200 may be subtracted from each other to generate the first power metric. Likewise, the squared outputs that are associated with negative frequencies and filter 250 may be subtracted from each other to generate the second power metric. In embodiments, subtractor 230 may then subtract the resulting first and second power metrics from each other to produce the sought after measure of imbalance, e.g., by outputting a frequency (S-) curve, here, for the X-polarization.

In embodiments, the squaring process comprises squaring the difference of the I components of filter 200 and adding the result to the square of the Q components of filter 200 to generate the first power metric associated with positive frequencies, e.g., corresponding to the positive frequencies generated in FIG. 2. Similarly, the difference of the I components of filter 2 are squared and added to the square of the Q components of filter 2 to generate the second power metric associated with negative frequencies, e.g., corresponding to the negative frequencies generated in FIG. 2B.

In embodiments, the measure of imbalance is expected to be proportional to the frequency offset. Thus, the so derived measure may be used to enable frequency discriminator 300 to be relatively broad-band and, ideally, insensitive to polarization, symbol phase, and timing of the signal, thus, eliminating unwanted dependencies on other synchronization circuits or sub-circuits.

It is noted that not shown in FIG. 3 is circuitry comprising the two filters that correspond to the Y-polarization signals. A person of skill in the art will have no trouble recognizing the duality in the two branches of the receiver and understand how to construct an exemplary ultra-wide band linear frequency discriminator that comprises, e.g., sixteen resistors, sixteen capacitors, and eight squaring circuits. It is further noted that frequency detector 300 does not have to rely on other feedback loops having previously converged before estimating frequency.

Figure 4B:
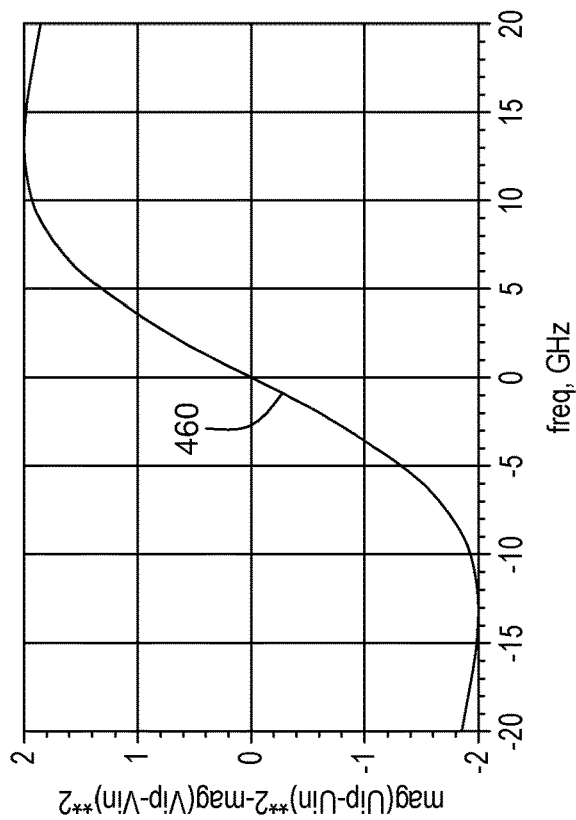
FIG. 4B shows a frequency discriminator plot corresponding to FIG. 4A.
Figure 4A:
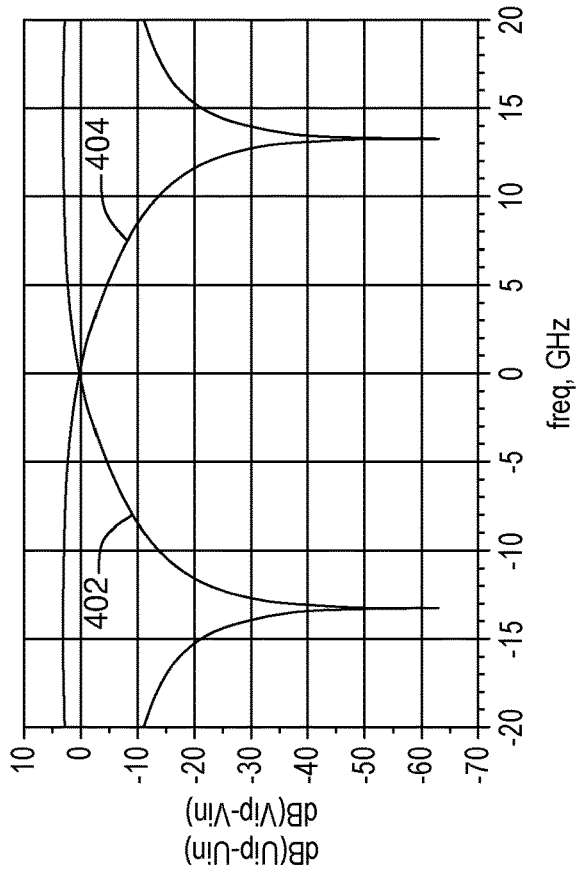
FIG. 4A is a graph that plots filter characteristics for I-polarization signals of polyphase filters according to embodiments of the present disclosure.

FIG. 4A is a graph that plots filter characteristics for I-polarization signals of polyphase filters according to embodiments of the present disclosure. Plot 400 is an AC simulation of the frequency responses of the two polyphase filters 200 and 250 in respective FIG. 2A and FIG. 2B. As can be observed from frequency response 402, which corresponds to the I-polarization signal for filter 200, and frequency response 404, which corresponds to the I-polarization signal for filter 250, the two filters 200, 250 have opposite passbands and opposite stop-bands for the same polarization.

FIG. 4B shows a frequency discriminator plot corresponding to FIG. 4A. In embodiments, frequency discriminator plot (or S-curve) 450 may be obtained by subtracting the respective squares of frequency responses 402 and 404 from each other. S-curve 450 indicates that the frequency offset comprises linear range 460 that spans at least 5 GHz. It is understood that S-curve 450 may be designed according to specific requirements of a given application.

Figure 5:
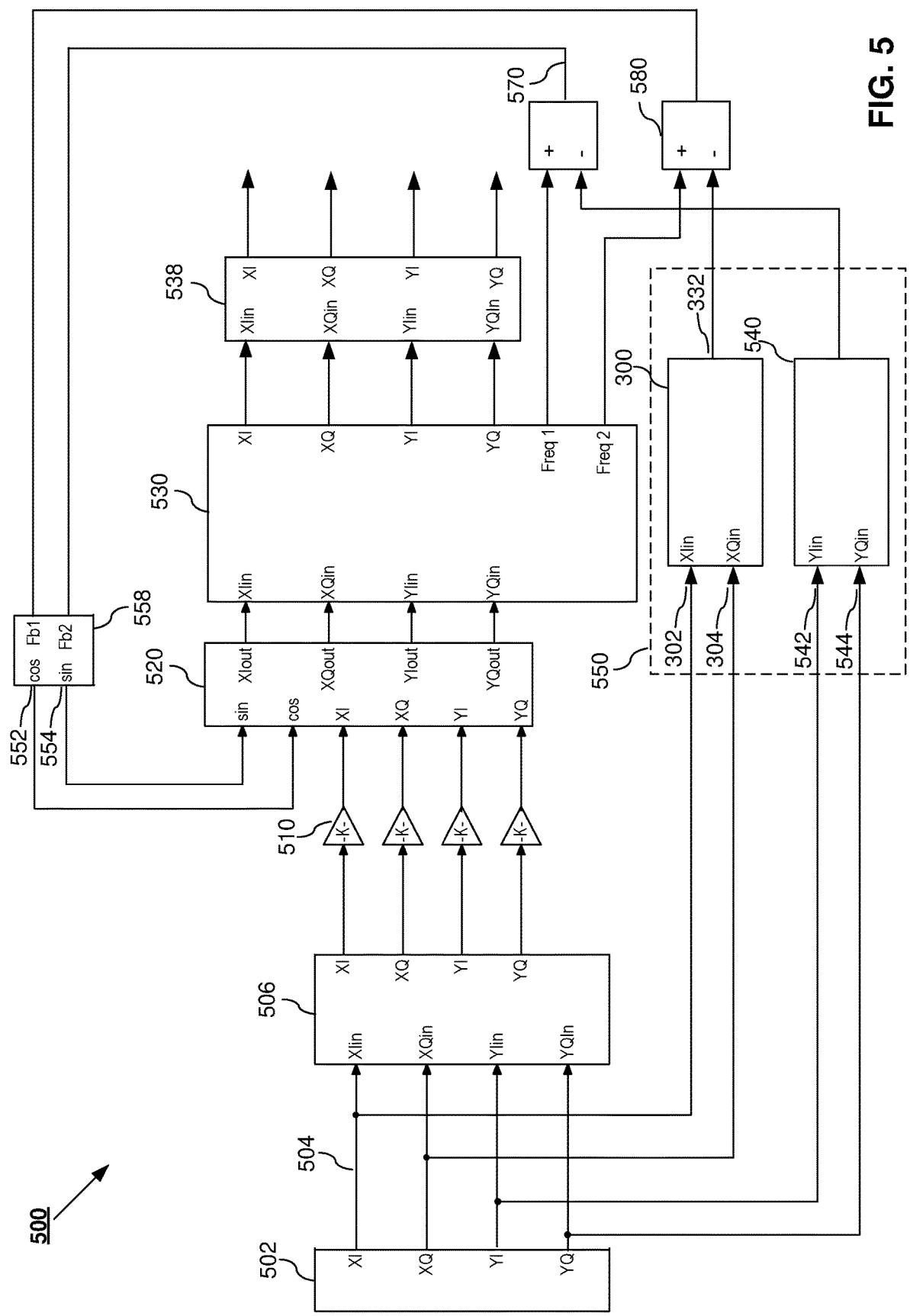
FIG. 5 illustrates an exemplary zero-IF receiver system that utilizes a broad-band frequency detector according to embodiments of the present disclosure.

FIG. 5 illustrates an exemplary zero-IF receiver system that utilizes a broad-band frequency detector according to embodiments of the present disclosure. System 500 comprises chromatic dispersion front-end equalizer 506, carrier frequency offset circuit 520, fine frequency offset detector circuit 530, back-end equalizer 538, and digitally controlled oscillator 558. Some of these circuit components are disclosed in greater detail in U.S. Patent Application No. 62/942,045, filed on Nov. 29, 2019, entitled "Chromatic Dispersion Equalizer Adaption Systems and Methods," listing as inventors Charles Razzell, which application is herein incorporated by reference as to its entire content and for all purposes. For brevity those circuit components and their most of their functions are not repeated herein.

System 500 further comprises broad-band frequency detector 550 that may comprise analog discriminators 300, 540 similar to those depicted in FIG. 3. As depicted in FIG. 5, analog discriminators 300, 540 that may be coupled in a feedback loop (e.g., 570) are configured as coarse frequency detectors. The feedback loop may comprise summer circuits (e.g., 580) that may sum the outputs of fine frequency offset detector 530 and coarse frequency offset detector (e.g., 300) into VCO loop 570. In embodiments, the gain of amplifiers 510 may be adjusted such that, e.g., once fine frequency offset detector 530 is operational, it dominates over coarse frequency offset detector outputs (e.g., 332).

In embodiments, the relative loop gain of the frequency control loop using fine frequency offset detector 530 is adjusted so that it is greater by a factor of two or more than the loop gain of the frequency control loop (e.g., 570) using coarse frequency detector (e.g., 300). In that way, in the frequency offset zone where both frequency detectors are operative, the fine frequency loop control will be the dominant loop control that primarily determines the loop dynamics of the combined control loop, including its steady-state value. It is understood that the relative gains of the coarse and fine frequency detectors may be set statically.

Carrier frequency offset circuit 520 may comprise mixers that mix down the VCO frequency and the incoming signal.

In embodiments, a signal (e.g., 332) created within frequency detector may drive the feedback loop like a conventional frequency lock loop that feeds a signal back to local oscillator 558 or a set of VCOs. As a result, the frequency offset may be fixed locally at receiver 500 using electrical methods. It is understood that any analog method known in the art may be used to determine the value of the frequency offset.

Figure 6B:
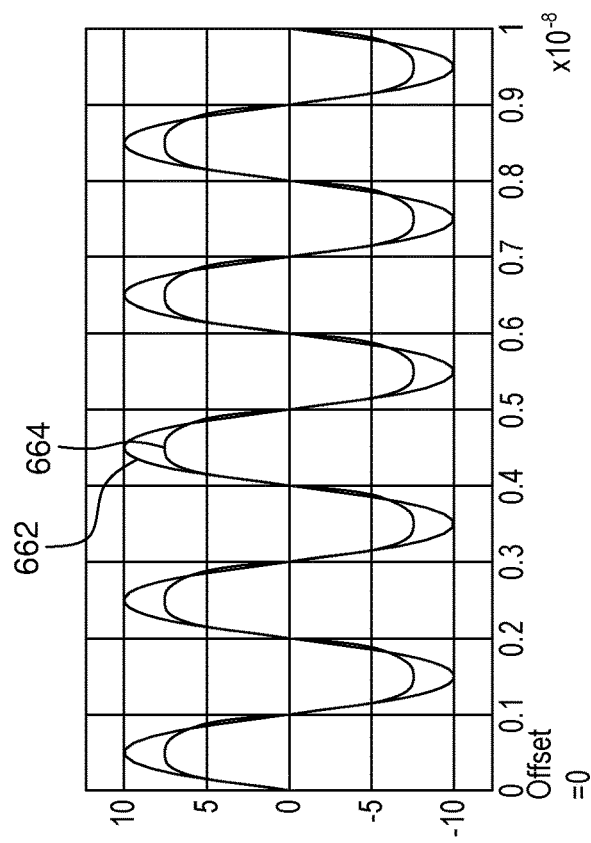
FIG. 6B shows simulation results for a 10 GHz peak deviation.
Figure 6A:
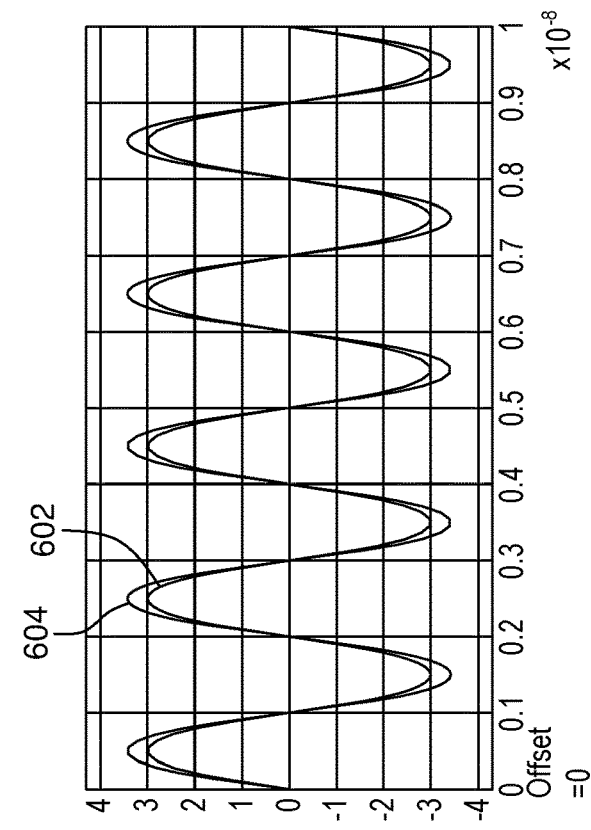
FIG. 6A shows simulation results for a 3 GHz peak deviation.

FIG. 6A shows simulation results for a 3 GHz peak deviation. Simulation results demonstrate that the frequency capture range may be extended to ±5 GHz. This advantageously remove the need for a linear search over the possible offsets. FIG. 6B shows simulation results for a 10 GHz peak deviation that indicate the effects of compression due to saturation of the discriminator S-curve at ±10 GHz according to the frequency discriminator plot in FIG. 4B.

Figure 7:
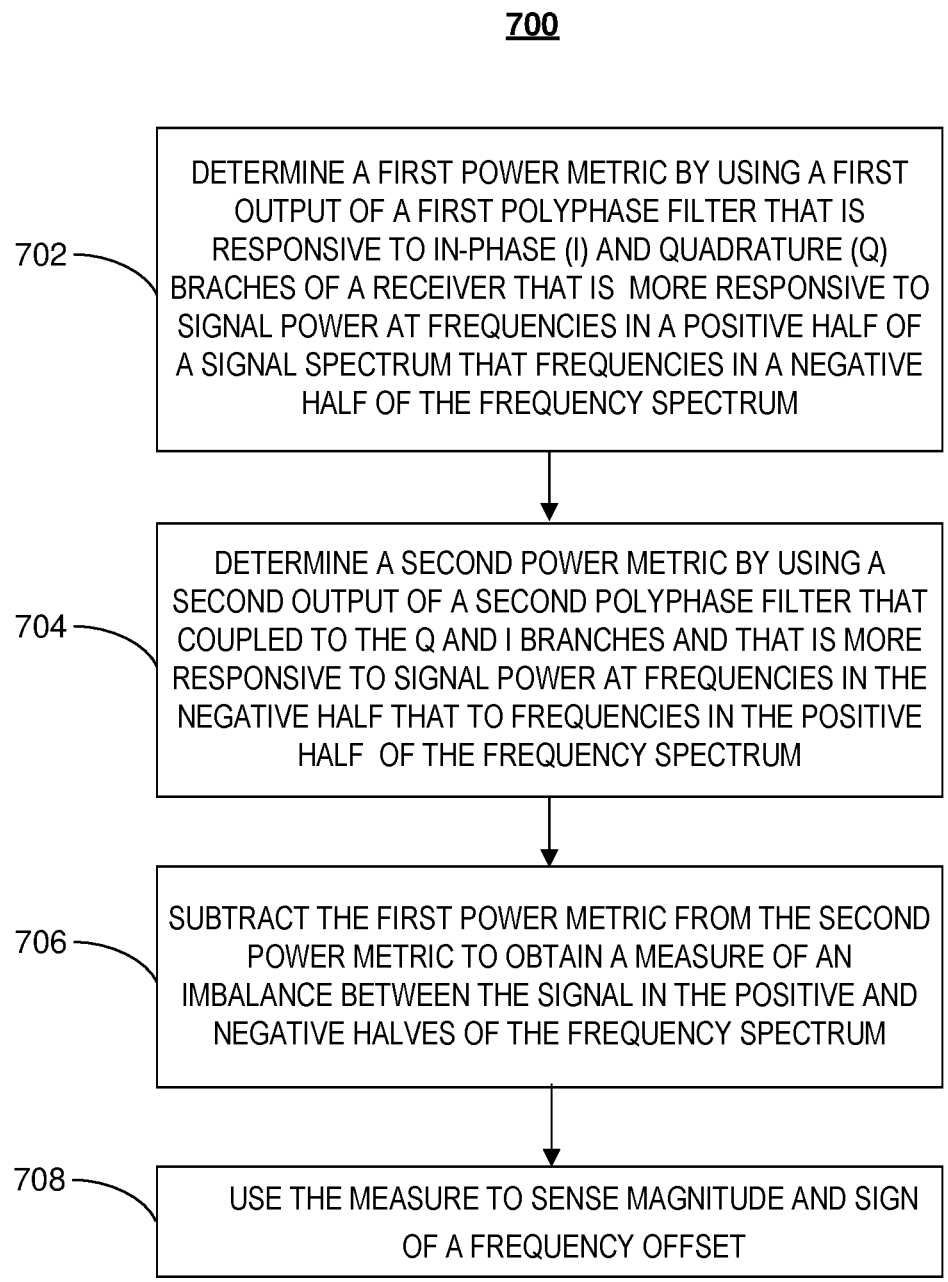
FIG. 7 is a flowchart of a process for estimating a frequency offset in a broad-band, zero-IF receiver system, according to embodiments of the present disclosure.

FIG. 7 is a flowchart of a process for estimating a frequency offset in a broad-band, zero-IF receiver system, according to embodiments of the present disclosure. The process for estimating the frequency offset begins at step 702, when a first power metric may be determined by using a first output of a first polyphase filter that is responsive to Q- and I-braches of a receiver that is more responsive to signal power at frequencies in a positive half of a signal spectrum that frequencies in a negative half of the frequency spectrum.

At step 704, a second power metric may be determined by using a second output of a second polyphase filter that coupled to the Q- and I-branches and that is more responsive to signal power at frequencies in the negative half that to frequencies in the positive half of the frequency spectrum.

At step 706, the first and second power metrics may be used, e.g., subtracted from each other or compared otherwise, to obtain a measure of an imbalance between the signal in the positive and negative halves of the frequency spectrum.

At step 708, the measure may then be used to sense at least one of a magnitude of a frequency offset or a sign of a frequency offset.

One skilled in the art shall recognize that: (1) certain steps may optionally be performed; (2) steps may not be limited to the specific order set forth herein; (3) certain steps may be performed in different orders; and (4) certain steps may be done concurrently.

FIG. 8A illustrates frequency adaption for a 0 Hz frequency offset, according to embodiments of the present disclosure. As can be seen in FIG. 8A, the fine frequency detectors dominate over the coarse frequency detector outputs in less than 1000 ns, when after pre-charging the loop filter, regular closed-loop control is enabled at about 750 ns that uses an existing LMS algorithm. FIG. 8B shows corresponding simulation results for a constellation diagram for a Y-polarization output of an equalizer that uses a broadband frequency detector, according to embodiments of the present disclosure.

Figure 9B:
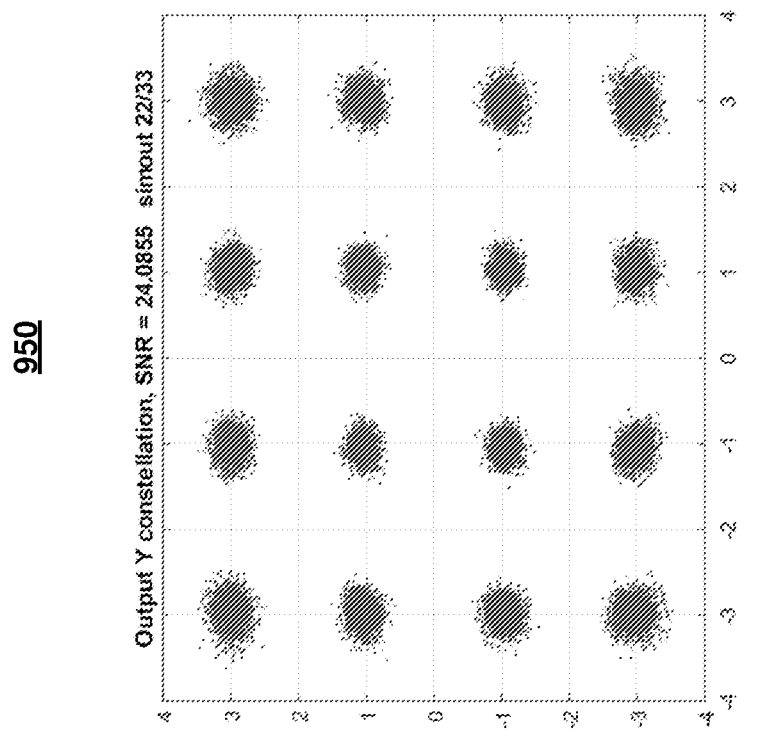
FIG. 9B shows simulation results for a constellation diagram for a Y-polarization output of an equalizer that uses a broad-band frequency detector, according to embodiments of the present disclosure.
Figure 9A:
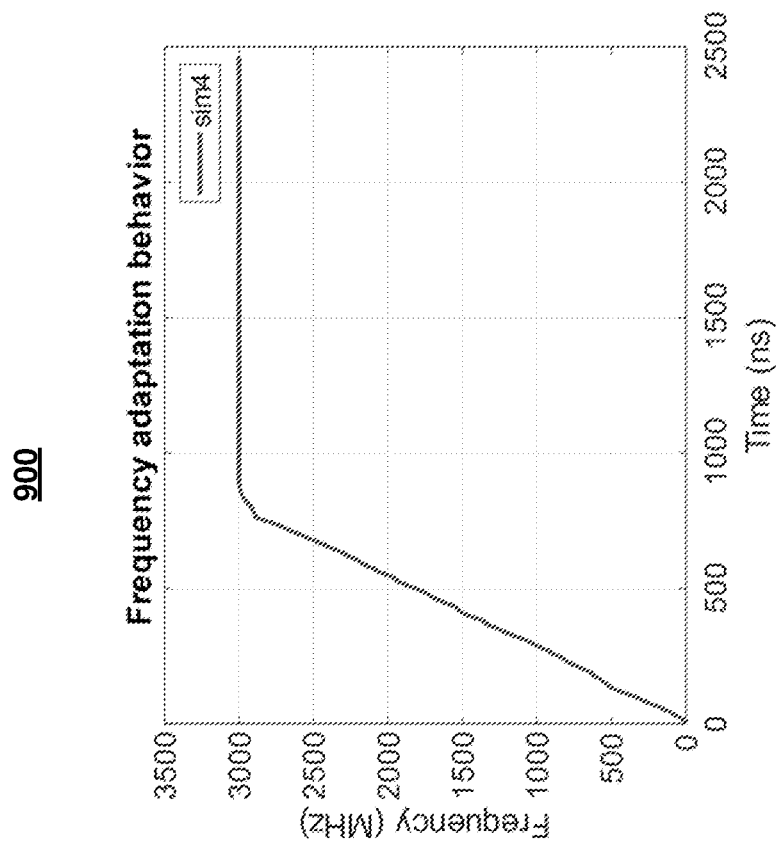
FIG. 9A illustrates frequency adaption for a +3 GHz frequency offset, according to embodiments of the present disclosure.

FIG. 9A illustrates frequency adaption for a +3 GHz frequency offset, according to embodiments of the present disclosure. Like for the 0 Hz frequency offset in FIG. 8A, the fine frequency detectors dominate over the coarse frequency detector outputs in less than 1000 ns. FIG. 9B shows corresponding simulation results for a constellation diagram for a Y-polarization output of an equalizer that uses a broad-band frequency detector, according to embodiments of the present disclosure.

Figure 10B:
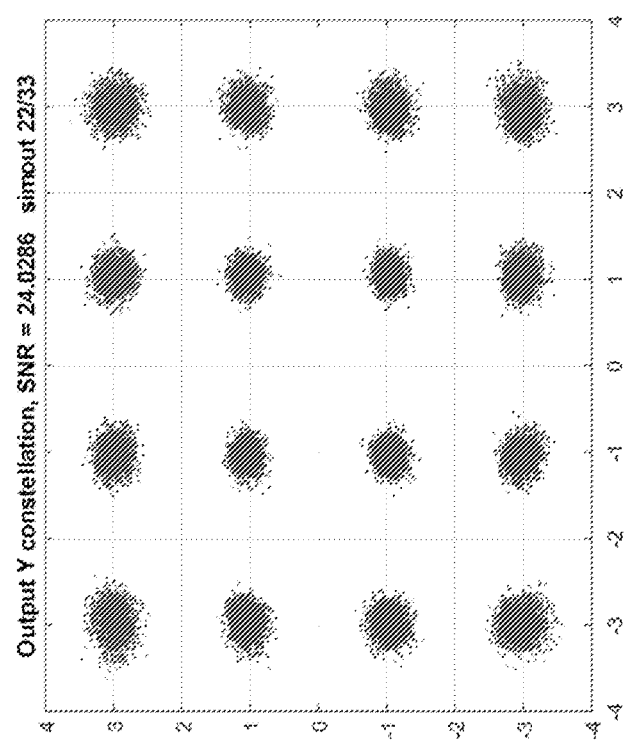
FIG. 10B shows simulation results for a constellation diagram for a Y-polarization output of an equalizer that uses a broad-band frequency detector, according to embodiments of the present disclosure.
Figure 10A:
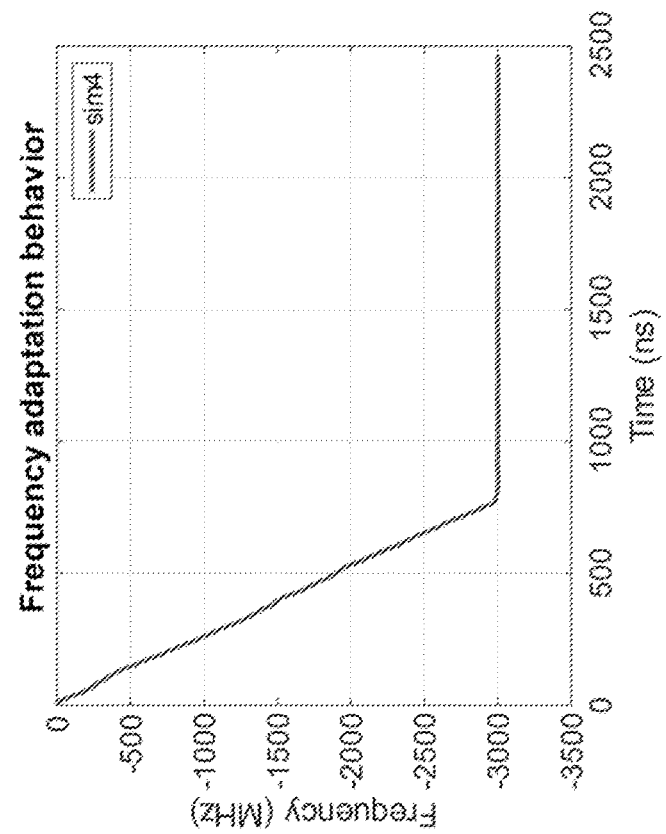
FIG. 10A illustrates frequency adaption at −3 GHz frequency offset, according to embodiments of the present disclosure.

FIG. 10A illustrates frequency adaption at −3 GHz frequency offset, according to embodiments of the present disclosure. Again, the fine frequency detectors dominate over the coarse frequency detector outputs in less than 1000 ns. FIG. 10B shows corresponding simulation results for a constellation diagram for a Y-polarization output of an equalizer that uses a broad-band frequency detector, according to embodiments of the present disclosure.

Aspects of the present disclosure may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using Application Specific Integrated Circuits (ASICs), programmable arrays, digital signal processing circuitry, or the like. Accordingly, the terms in any claims are intended to cover both software and hardware implementations. The term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present disclosure may further relate to computer products with a non-transitory, tangible computer-readable medium that have computer code thereon for performing various computer-implemented operations. The media and computer code may be those specially designed and constructed for the purposes of the present disclosure, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as ASICs, programmable logic devices (PLDs), flash memory devices, and ROM and RAM devices. Examples of computer code include machine code, such as produced by a compiler, and files containing higher level code that are executed by a computer using an interpreter. Embodiments of the present disclosure may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present disclosure. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A method for estimating a frequency offset in a broadband, zero-IF receiver system that has in-phase and quadrature receiver branches, the method comprising:
   determining a first power metric by using a first output of a first polyphase filter that is coupled to in-phase (I) and quadrature (Q) branches of a receiver and that is more responsive to signal power at frequencies in a positive half of a signal spectrum than frequencies in a negative half of the frequency spectrum;
   determining a second power metric by using a second output of a second polyphase filter that is coupled to the I and Q branches and that is more responsive to signal power at frequencies in the negative half than to frequencies in the positive half of the frequency spectrum;
   using the first and second power metrics to obtain a measure of an imbalance between the signal power in the positive and negative halves of the frequency spectrum; and
   using the measure to determine at least one of a magnitude of a frequency offset or a sign of a frequency offset.

2. The method according to claim 1, further comprising using the measure to adjust the frequency offset.

3. The method according to claim 1, wherein the first and second polyphase filters comprise a passive RC network that comprises capacitors and resistors.

4. The method according to claim 3, further comprising cross-coupling the capacitors and resistors between in-phase and quadrature branches of a receiver.

5. The method according to claim 1, wherein the first and second polyphase filters are configured as coarse frequency detectors.

6. The method according to claim 5, further comprising summing an output of one or more fine frequency detectors with outputs of a coarse frequency detector.

7. The method according to claim 6, further comprising adjusting a gain such that the one or more fine frequency detectors dominate over the output of the coarse frequency detector.

8. The method according to claim 1, wherein the first and second power metrics are obtained by steps comprising squaring respective outputs of the first and second polyphase filters to determine which filter outputs a greater signal.

9. A broad-band frequency detector for estimating a frequency offset, the broad-band frequency detector comprising:
- a first polyphase filter that receives a modulated input signal and determines a first power metric, the first polyphase filter having greater gain at positive frequencies than at negative frequencies;
- a second polyphase filter that that receives the modulated input signal and determines a second power metric, the second polyphase filter having greater gain at negative frequencies than at positive frequencies; and
- a comparator circuit that uses the first and second power metrics to obtain a measure of an imbalance between positive and negative halves of a frequency spectrum, the measure being substantially proportional to a frequency offset, the broad-band frequency detector uses the measure to adjust the frequency offset.

10. The broad-band frequency detector according to claim 9, wherein the first and second polyphase filters have passbands that are substantially mirrored with respect to each other around a DC value.

11. The broad-band frequency detector according to claim 9, wherein the first and second polyphase filters have stopbands that are substantially mirrored with respect to each other around a DC value.

12. The broad-band frequency detector according to claim 9, wherein the first and second power metrics are obtained by steps comprising squaring respective outputs of the first and second polyphase filters.

13. The broad-band frequency detector according to claim 12, wherein each of the first and second polyphase filters comprises a passive polyphase RC network.

14. The broad-band frequency detector according to claim 13, wherein the passive polyphase RC network comprises one or more adjustable circuit components.

15. The broad-band frequency detector according to claim 13, wherein the passive polyphase RC network for the first polyphase filter comprises capacitors and resistors that are cross-coupled between in-phase and quadrature branches of a receiver.

* * * * *